United States Patent [19]
Wu et al.

[11] Patent Number: 5,475,327
[45] Date of Patent: Dec. 12, 1995

[54] VARIABLE IMPEDANCE CIRCUIT

[75] Inventors: Jieh-Tsong Wu, Taipei; Wei-Zen Chen, Tou-Liu, both of Taiwan

[73] Assignee: National Science Council of R.O.C., Taipei, Taiwan

[21] Appl. No.: 342,351

[22] Filed: Nov. 18, 1994

[51] Int. Cl.$^6$ ........................................................ H03L 5/00
[52] U.S. Cl. ............................................ 327/308; 327/524
[58] Field of Search ................................ 327/52, 308, 65, 327/356, 89, 359, 246, 524, 254, 561, 256, 563

[56] References Cited

U.S. PATENT DOCUMENTS

| | | | |
|---|---|---|---|
| 4,344,188 | 8/1982 | Tanabe et al. | 455/326 |
| 5,329,173 | 7/1994 | Murakami et al. | 327/65 |
| 5,329,189 | 7/1994 | Ushida et al. | 327/65 |

Primary Examiner—Timothy P. Callahan
Assistant Examiner—Jeffrey Zweizig
Attorney, Agent, or Firm—Morgan & Finnegan

[57] ABSTRACT

A variable impedance circuit includes a differential circuit, an impedance element, a variable current attenuator and a pair of level shifters. The differential circuit includes a transistor pair with a pair of input terminals, a pair of output terminals, and a pair of emitters. The impedance element is connected between the emitters of the transistor pair. The variable current attenuator has a pair of input terminals connected respectively to the output terminals of the transistor pair, a pair of output terminals, and a pair of control inputs for receiving a control voltage to vary the current gain of the variable current attenuator. Each of the level shifters has an input terminal connected to a respective one of the output terminals of the variable current attenuator, and an output terminal connected to a respective one of the input terminals of the transistor pair. The level shifters ensure that the transistor pair and the variable current attenuator are properly biased. When the current gain of the variable current attenuator is varied, an impedance measured across the output terminals of the variable current attenuator is correspondingly varied.

8 Claims, 3 Drawing Sheets

VARIABLE IMPEDANCE CIRCUIT

BACKGROUND OF THE INVENTION

1. Field of the Invention

The invention relates to a variable impedance circuit, more particularly to a variable impedance circuit which can be implemented entirely in a semiconductor chip.

2. Description of the Related Art

Variable impedance circuits are used in a variety of electronic circuits, such as filters and voltage-controlled oscillators. Since most of these electronic circuits have come to be incorporated in semiconductor chips as monolithic integrated circuits, it would be desirable to have a variable impedance circuit which can be made compatible with the integrated circuit, i.e. to be internal to the monolithic chip, so as to reduce the size and minimize the complexity of the electronic circuit.

SUMMARY OF THE INVENTION

Therefore, the object of the present invention is to provide a variable impedance circuit which can be implemented entirely in a semiconductor chip, thereby making it ideal for use in monolithic integrated circuits.

Accordingly, the variable impedance circuit of this invention comprises a differential circuit, an impedance element, a variable current attenuator and a pair of level shifters, such as diodes or transistors. The differential circuit includes a transistor pair with a pair of bases that serve as input terminals, a pair of collectors that serve as output terminals, and a pair of emitters. The impedance element is connected between the emitters of the transistor pair and may be a resistive, capacitive or inductive element. The variable current attenuator has a pair of input terminals connected respectively to the output terminals of the transistor pair, a pair of output terminals, and a pair of control inputs for receiving a control voltage to vary the current gain of the variable current attenuator. Each of the level shifters has an input terminal connected to a respective one of the output terminals of the variable current attenuator, and an output terminal connected to a respective one of the input terminals of the transistor pair. The level shifters ensure that the transistor pair and the variable current attenuator are properly biased. When the current gain of the variable current attenuator is varied, an impedance measured across the output terminals of the variable current attenuator is correspondingly varied.

In the disclosed embodiment, the variable current attenuator comprises first, second, third and fourth transistors. The first and second transistors have emitters which are connected together and which serve as a first one of the input terminals of the variable current attenuator. The third and fourth transistors have emitters which are connected together and which serve as a second one of the input terminals of the variable current attenuator. The first and third transistors have collectors which are connected together and which serve as a first one of the output terminals of the variable current attenuator. The second and fourth transistors have collectors which are connected together and which serve as a second one of the output terminals of the variable current attenuator. The first and fourth transistors have bases which are connected together and which serve as a first one of the control inputs of the variable current attenuator. The second and third transistors have bases which are connected together and which serve as a second one of the control inputs of the variable current attenuator.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
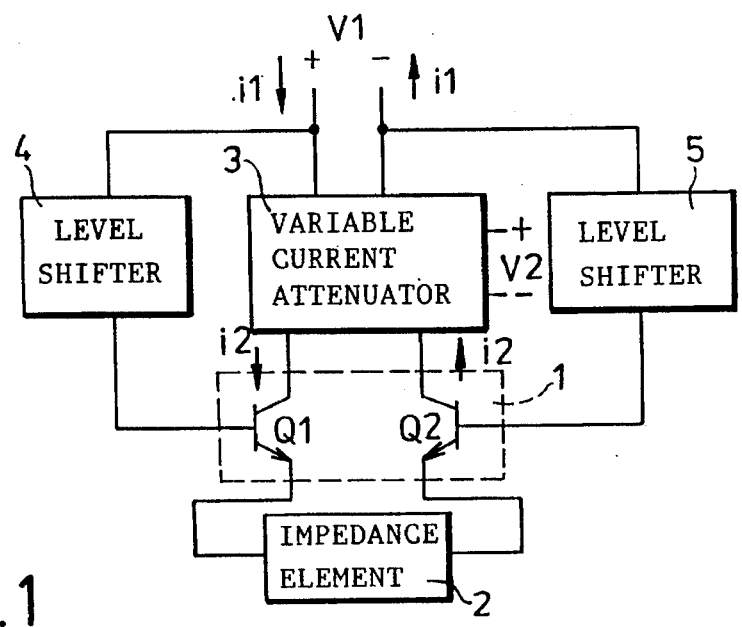
FIG. 1 is a schematic circuit diagram expressing the preferred embodiment of a variable impedance circuit according to the present invention as an AC circuit.
Figure 2:
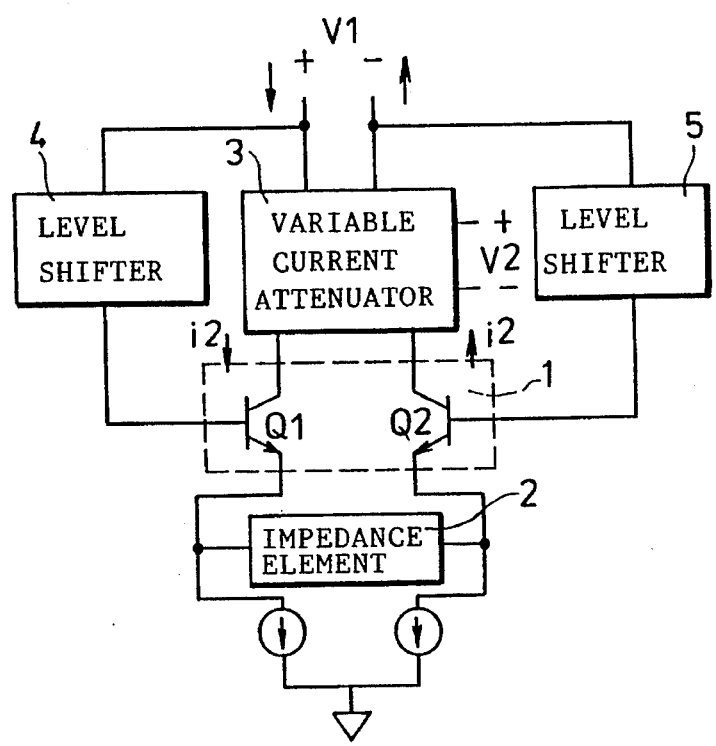
FIG. 2 is a schematic circuit diagram expressing the preferred embodiment as both an AC and a DC circuit.

Referring to FIGS. 1 and 2, the preferred embodiment of a variable impedance circuit according to the present invention is shown to comprise a differential circuit 1, an impedance element 2, a variable current attenuator (or current amplifier) 3, and a pair of level shifters 4, 5.

Figure 3:
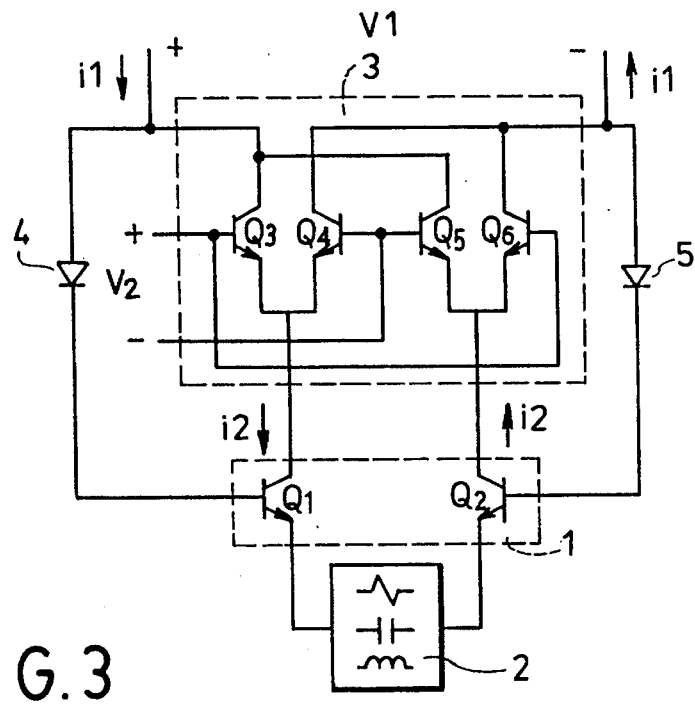
FIG. 3 is a first detailed circuit diagram of the preferred embodiment.

As shown in FIG. 3, the differential circuit 1 includes a transistor pair Q1, Q2 with a pair of bases that serve as input terminals, a pair of collectors that serve as output terminals, and a pair of emitters. The impedance element 2 is connected between the emitters of the transistor pair Q1, Q2 and may be a resistive, capacitive or inductive element. The variable current attenuator 3 has a pair of input terminals connected respectively to the output terminals of the transistor pair Q1, Q2, a pair of output terminals, and a pair of control inputs for receiving a control voltage V2 to vary the current gain of the variable current attenuator 3. The control inputs may both be connected to an external control device. Alternatively, one of the control inputs may be connected to a reference voltage node of the variable impedance circuit in a known manner.

Figure 4:
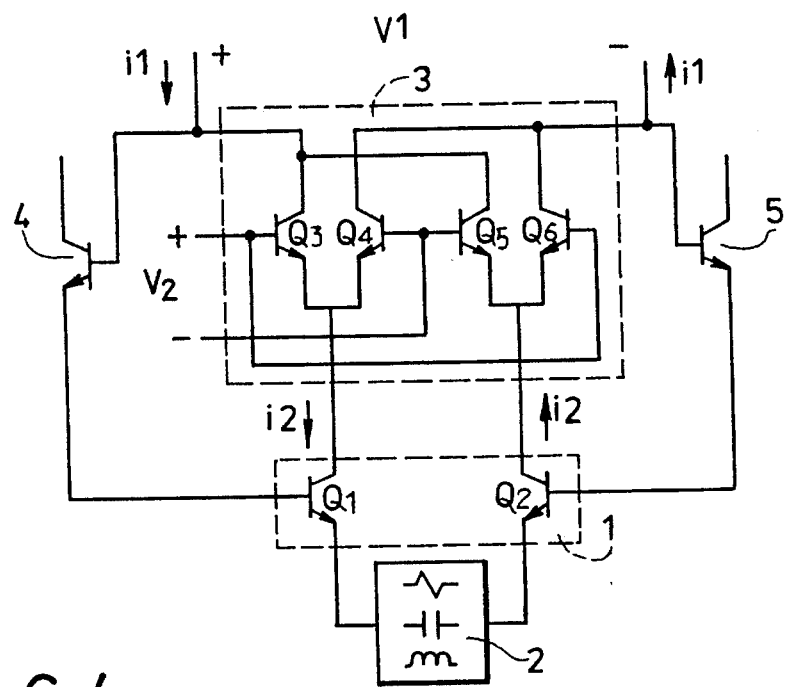
FIG. 4 is a second detailed circuit diagram of the preferred embodiment.
Figure 5:
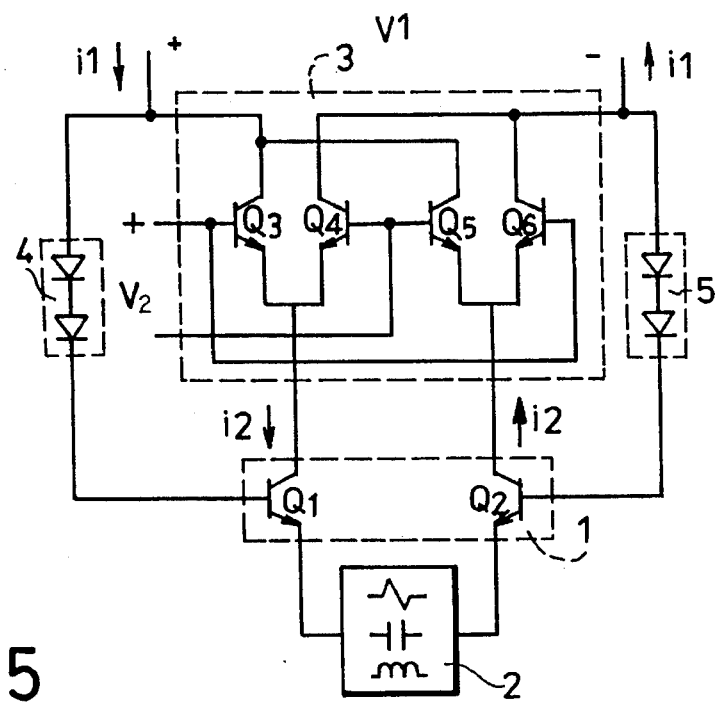
FIG. 5 is a third detailed circuit diagram of the preferred embodiment.
Figure 6:
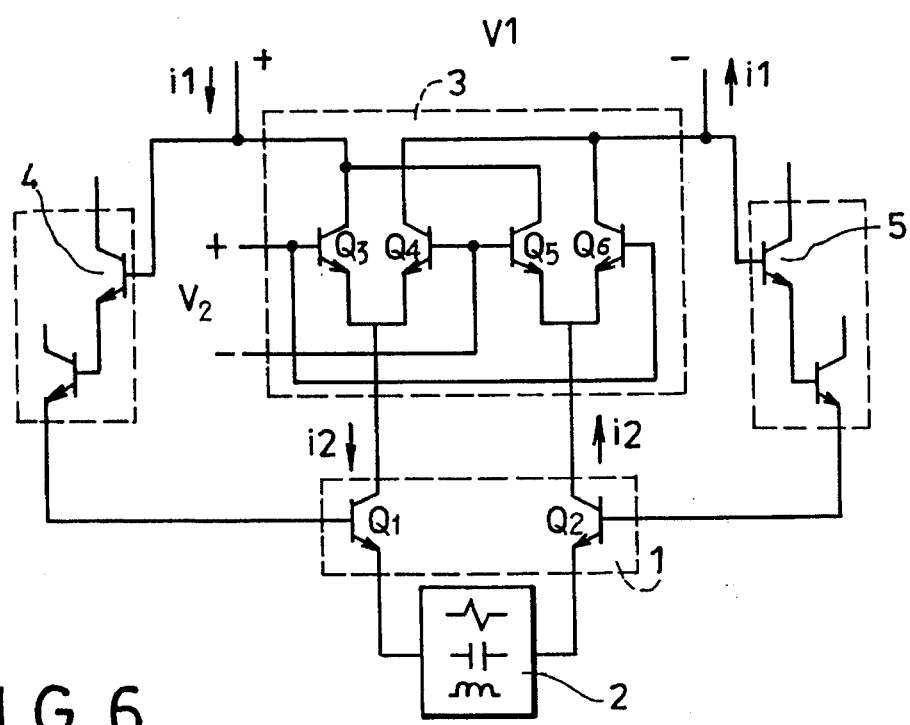
FIG. 6 is a fourth detailed circuit diagram of the preferred embodiment.

Each of the level shifters 4, 5 has an input terminal connected to a respective one of the output terminals of the variable current attenuator 3, and an output terminal connected to a respective one of the input terminals of the transistor pair Q1, Q2. Each of the level shifters 4, 5 may be a single diode, as shown in FIG. 3, a single transistor having a base that serves as the input terminal thereof and an emitter that serves as the output terminal thereof, as shown in FIG. 4, a pair of serially interconnected diodes, as shown in FIG. 5, or a pair of transistors, as shown in FIG. 6. The level shifters 4, 5 are used to ensure that the transistor pair Q1, Q2 and the variable current attenuator 3 are properly DC biased. In FIGS. 3 to 6, the level shifters 4, 5 bias the transistor pair Q1, Q2 and the variable current attenuator 3 at forward active regions.

Preferably, the variable current attenuator 3 comprises first, second, third and fourth transistors Q3, Q4, Q5, Q6. The first and second transistors Q3, Q4 have emitters which are connected together and which serve as a first one of the input terminals of the variable current attenuator 3. The third and fourth transistors Q5, Q6 have emitters which are connected together and which serve as a second one of the input terminals of the variable current attenuator 3. The first and third transistors Q3, Q5 have collectors which are connected together and which serve as a first one of the output terminals of the variable current attenuator 3. The second and fourth transistors Q4, Q6 have collectors which are connected together and which serve as a second one of the output terminals of the variable current attenuator 3. The first and fourth transistors Q3, Q6 have bases which are connected together and which serve as a first one of the control inputs of the variable current attenuator 3. The second and third transistors Q4, Q5 have bases which are connected together and which serve as a second one of the control inputs of the variable current attenuator 3.

The operation of the preferred embodiment is described as follows:

Suppose the AC voltage applied at the input terminals of the differential circuit 1 is V1, and the voltage-current conversion factor of the differential circuit 1 is gm1, the output AC current i2 is given as follows:

$$i2 = gm1 * V1 \quad (1)$$

Suppose the current gain of the variable current attenuator 3 is Ai, the output current i1 flowing due to the output AC current i2 is given as follows:

$$i1 = Ai * i2 \quad (2)$$

The current gain Ai of the variable current attenuator 3 is determined by the control voltage V2 and is given as follows:

$$Ai = [1 - e^{-2(V2/VT)}]/[1 + 2e^{-V2/VT} + e^{-2(V2/VT)}] \quad (3)$$

wherein VT is the thermal voltage.

The voltage-current conversion factor gm1 of the differential circuit 1 is determined by the impedance Z of the impedance element 2 and the emitter resistance re1 of the transistor pair Q1, Q2, and is obtained as follows:

$$gm1 = 1/(Z + 2re1) \quad (4)$$

Assuming that $2re1 \ll |Z|$, it follows that $$gm1 = 1/Z \quad (5)$$

Substituting equations (1), (3) and (5) into equation (2) yields $$i1 = \{[1 - e^{-2(V2/VT)}]/[1 + 2e^{-V2/VT} + e^{-2(V2/VT)}]\} * (1/Z) * V1 \quad (6)$$

As a result, the impedance Znew measured across the output terminals of the variable current attenuator 3 is given as follows:

$$Znew = Z[1 + 2e^{-V2/VT} + e^{-2(V2/VT)}]/[1 - e^{-2(V2/VT)}]$$

Thus, when the control voltage V2 is varied to vary the current gain Ai of the variable current attenuator 3, the impedance Znew is correspondingly varied.

Note that the various circuit elements employed in the present invention can be implemented in a semiconductor chip. For example, the various transistors employed in the variable impedance circuit may be implemented as BJT transistors or as MOSFET transistors. The features and objects of the present invention are thus achieved.

While the present invention has been described in connection with what is considered the most practical and preferred embodiment, it is understood that this invention is not limited to the disclosed embodiment, but is intended to cover various arrangements included within the spirit and scope of the broadest interpretation so as to encompass all such modifications and equivalent arrangements.

We claim:

1. A variable impedance circuit, comprising:
    a differential circuit including a transistor pair with a pair of input terminals, a pair of output terminals, and a pair of emitters;
    an impedance element connected between said emitters of said transistor pair;
    a variable current attenuator having a pair of input terminals connected respectively to said output terminals of said transistor pair, a pair of output terminals, and a pair of control inputs for receiving a control voltage to vary current gain of said variable current attenuator; and
    a pair of level shifters, each of which having an input terminal connected to a respective one of said output terminals of said variable current attenuator, and an output terminal connected to a respective one of said input terminals of said transistor pair, said level shifters ensuring that said transistor pair and said variable current attenuator are properly biased;
    whereby, varying of said current gain of said variable current attenuator results in varying of an impedance measured across said output terminals of said variable current attenuator.

2. The variable impedance circuit as claimed in claim 1, wherein said impedance element is a resistive element.

3. The variable impedance circuit as claimed in claim 1, wherein said impedance element is a capacitive element.

4. The variable impedance circuit as claimed in claim 1, wherein said impedance element is an inductive element.

5. The variable impedance circuit as claimed in claim 1, wherein said variable current attenuator comprises a first transistor, a second transistor, a third transistor and a fourth transistor, said first and second transistors having emitters which are connected together and which serve as a first one of said input terminals of said variable current attenuator, said third and fourth transistors having emitters which are connected together and which serve as a second one of said input terminals of said variable current attenuator, said first and third transistors having collectors which are connected together and which serve as a first one of said output terminals of said variable current attenuator, said second and fourth transistors having collectors which are connected together and which serve as a second one of said output terminals of said variable current attenuator, said first and fourth transistors having bases which are connected together and which serve as a first one of said control inputs of said variable current attenuator, and said second and third transistors having bases which are connected together and which serve as a second one of said control inputs of said variable current attenuator.

6. The variable impedance circuit as claimed in claim 5, wherein said transistor pair of said differential circuit has a pair of bases which serve as said input terminals thereof and a pair of collectors which serve as said output terminals thereof.

7. The variable impedance circuit as claimed in claim 1, wherein each of said level shifters includes a diode.

8. The variable impedance circuit as claimed in claim 1, wherein each of said level shifters includes a transistor having a base that serves as said input terminal thereof and an emitter that serves as said output terminal thereof.

* * * * *